United States Patent [19]

Yokoyama

[11] 4,093,925

[45] June 6, 1978

[54] METHOD AND SYSTEM OF DRIVING POWER FIELD EFFECT TRANSISTOR

[75] Inventor: Kenji Yokoyama, Hamamatsu, Japan

[73] Assignee: Nippon Gakki Seizo Kabushiki Kaisha, Hamamatsu, Japan

[21] Appl. No.: 632,899

[22] Filed: Nov. 18, 1975

[30] Foreign Application Priority Data

Jan. 27, 1975 Japan .................................. 50-11076
Jul. 8, 1975 Japan .................................. 50-83744

[51] Int. Cl.² .......................... H03F 3/16; H03F 3/21
[52] U.S. Cl. .................................. 330/277; 307/270; 307/315; 330/296; 330/299
[58] Field of Search ................ 307/270, 304, 315; 330/24, 35, 40

[56] References Cited

U.S. PATENT DOCUMENTS

| | | | |
|---|---|---|---|
| 3,462,701 | 8/1969 | Miller | 330/40 |
| 3,670,184 | 6/1972 | Idei et al. | 307/304 X |
| 3,921,089 | 11/1975 | Tsurushima | 330/35 X |

FOREIGN PATENT DOCUMENTS 2,129,108  2/1973  Germany.

OTHER PUBLICATIONS

Carlson, "Common Sense Design of Transistor Amplifiers," *Electronics World*; pp. 48–50, 52, 53; 6/1967.
*Electronics*, (pub.), pp. 100, 12/1966.
*Funkschau*, 1974, Heft 25, pp. 993–994.
Sherwin, "Biasing of FETs Ensures Consistent Circuit Performances," Electronic Engrg.; pp. 52–56; 4/1971.
Ott, "Biasing the Junction FET," EEE-Jan./1970; pp. 52–57.

*Primary Examiner*—Larry N. Anagnos
*Attorney, Agent, or Firm*—Cushman, Darby & Cushman

[57] ABSTRACT

A method and a system of obtaining a large power with the use of a junction field effect transistor by extending the working range to improve the utilization rate of the power source voltage. The range for the gate voltage is set up to some predetermined forward voltage at which the gate and the source will be subjected to a forward biasing. The source-to-drain internal resistance is reduced by this forward gate voltage, but no gate current is allowed to flow probably due to the existence of a non-linear element between the gate and the source.

9 Claims, 9 Drawing Figures

METHOD AND SYSTEM OF DRIVING POWER FIELD EFFECT TRANSISTOR

BACKGROUND OF THE INVENTION (a) Field of the Invention

The invention relates to a method and a system of driving a field effect transistor (FET) in a power stage and more particularly to a method and a system of driving a junction FET for providing a larger power by selecting the operating voltage range for the gate voltage.

(b) Description of the Prior Art

Among the junction type FET's, there are those which have pentode-like (saturated) characteristics and those which have triode-like (unsaturated) characteristics. In both of these junction-type FET's the gate voltage has been so selected as to be always of reverse polarity with respect to the junction between the gate and the source (channel) region. Particularly in the triode type junction FET's, however, the working range with the reverse gate voltage is limited with respect to the total range. Thus, the utilization rate of the power source voltage has not been satisfactory.

Thus, it has been desired, for the triode type junction FET's, to improve the power rating at least to the order of that of the pentode-type junction FET, and for the pentode type junction FET's to further improve the power rating.

SUMMARY OF THE INVENTION

An object of this invention is to provide a method and a system of driving a power-use junction field effect transistor which improves the utilization rate of the power source voltage by extending the working range.

According to one aspect of this invention, there is provided a method of driving a junction field effect transistor comprising a step of applying a gate voltage in a region extending to a predetermined forward voltage at which the gate and the source would apparently be subjected to forward biasing, and a system of driving a junction field effect transistor embodying the above method.

DETAILED DESCRIPTION OF THE INVENTION

Hereinbelow, description will be made in conjunction with the accompanying drawings.

Figure 1:
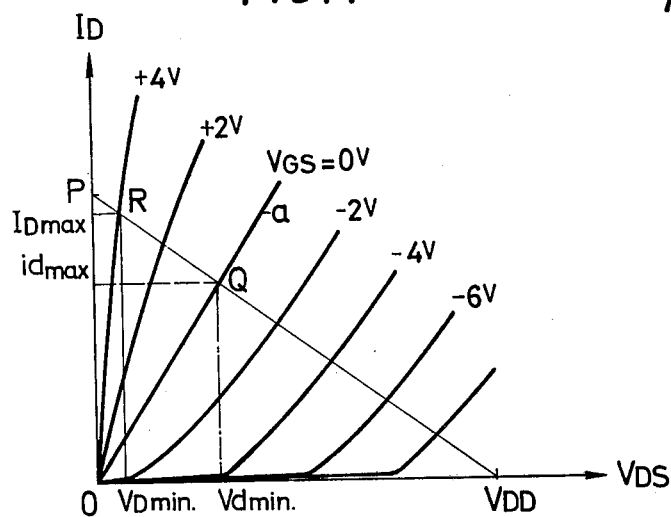
FIG. 1 shows triode-like characteristic curves of a junction FET.

FIG. 1 shows the output current-to-voltage characteristic curves of an n-channel junction FET having triode-like characteristics. The ordinate represents the drain current $I_D$ and the abscissa the drain-to-source voltage $V_{DS}$. The curve $a$ denoted as $V_{GS} = 0V$ corresponds to the so-called saturation drain current curve which represents the current flowing from the drain to the source when the gate is short-circuited with the source. The area below curve $a$ is the region which has been considered as the normal working region beyond which the junction FET has been considered to work no longer as an FET. When a load resistance $R_L$ is connected in series with the FET to derive the output, the load line can be represented as line P-$V_{DD}$ since the power source voltage $V_{DD}$ and the load resistance $R_L$ are fixed and there is a relation:

$$V_{DD} = V_{DS} + I_D R_L \tag{1}$$

Typical volumes of $R_L$ and $V_{DD}$ are 8Ω and nearly 100V. Point P represents the state where the FET has no resistance and point $V_{DD}$ the state where the FET is cut off. The working range (active region) of a junction FET has been considered to be below curve a, as described above, and the section $P_Q$ of the load line has not been utilized. Thus, the maximum drain current has been set at $i_{dmax}$ which corresponds to point Q and the drain-to-source voltage $V_{dmin}$. In this case, the maximum output power $P_{max}$ is given by $$P_{max} = (V_{DD} - V_{dmin}) \cdot i_{dmax}/2 \tag{2}$$

In the case of triode-type junction FET's for power use, the utilization rate of the voltage is of the order of 75%. If the load resistance is smaller, the utilization rate becomes worse as is apparent from FIG. 1.

Figure 2:
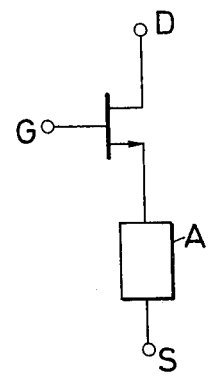
FIG. 2 shows an equivalent circuit for a junction FET.

This invention is to improve the utilization rate of the power source voltage. Particularly, the working range of the vertical FET (V-FET), i.e. power-use FET having triode-like characteristics, is narrow even compared with that of the usual junction FET having pentode-like characteristics. The present inventor, however, has found that the gate current of a junction FET does not become appreciable even when a forward voltage is applied to the gate-source junction if the gate-to-source voltage is below some particular voltage. This can be considered to be due to the existence of some non-linear element between the gate and the source. Namely, an equivalent circuit of a junction FET can be considered as is shown in FIG. 2, in which block A represents a non-linear element. The rising threshold voltage of such non-linear element A seems to be usually in the range of 0.2 to 4 volts. In the case of the element having the characteristics of FIG. 1 where $R_L$ is 8 Ω and $V_{DD}$ is nearly 100 volts, it was confirmed that the FET operates normally with a gate voltage $V_{GS}$ up to +4 volts. This means that the active or operable range can be extended to the line of $V_{GS} = +4$ volts, i.e. the maximum drain current can be raised to $I_{Dmax}$ and hence the minimum drain-to-source voltage can be reduced to $V_{Dmin}$ corresponding to point R on the load line. The maximum output Po in this case is $$Po = (V_{DD} - V_{Dmin}) \cdot I_{Dmax}/2 \tag{3}$$

The utilization rate of the power source voltage becomes about 90%, being improved by 15% as compared with the conventional case.

Hereinbelow, some embodiments of power amplifier circuits will be shown which utilize the fact that the forward gate voltage with respect to the gate-source junction can be applied, i.e. the junction FET can be over-driven.

Figure 3:
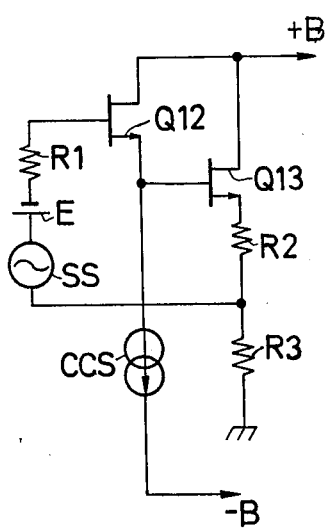
FIGS. 3 to 7 are circuit diagram of amplifiers for achieving the present invention.

FIG. 3 shows a relatively simple amplifier circuit, in which a junction FET Q13 is over-driven. In the figure, FET's Q12 and Q13 connected in Darlington connection have their drains connected to the positive voltage source +B. The source of the first FET Q12 and the gate of the second FET Q13 are connected together through a constant current source CCS to the negative voltage source −B. The source of the second FET Q13 is grounded through resistors R2 and R3. The gate of the first FET Q12 is connected through a resistor R1, a biasing voltage source E, and a signal source SS to the interconnection of the resistors R2 and R3. The resistance R3 is the load resistance.

In the circuit design, assuming that the maximum input signal voltage is esm and the desired maximum drain current and the required gate-to-source voltage of the second FET Q13 are Im and $V_{GSm}$ ($V_{GSm}$ is the maximum forward gate voltage which was approximately +4V in the case of using the FET of FIG. 1), the biasing voltage E and the resistance R2 are determined to satisfy the condition, esm − E = $V_{GSm}$ + ImR2.

Due to the existence of the non-linear element between the gate and the source as shown in the equivalent circuit of FIG. 2, a current feedback is applied and the net gate-to-source voltage becomes zero when the gate voltage becomes said maximum forward gate voltage.

Figure 4:
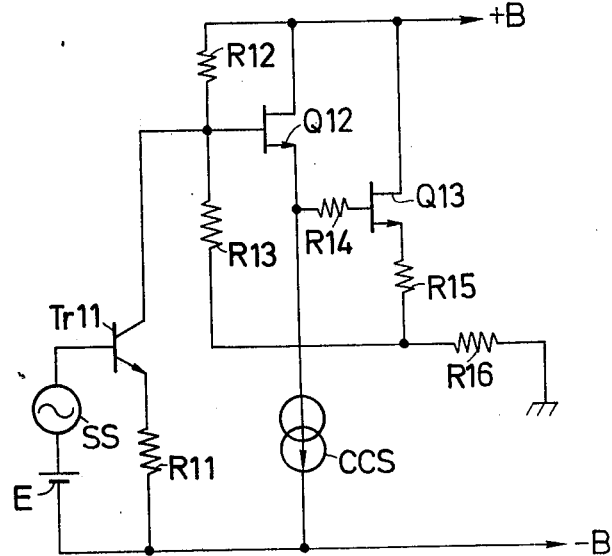

FIG. 4 shows a more practical circuit structure in which a junction FET Q13 in the output power stage is over-driven. The circuit may be divided into a first amplifier stage including a bipolar transistor Tr11 and a second amplifier stage including junction FET's Q12 and Q13. However, the basic concept for the operation of the circuit of FIG. 4 is similar to that of FIG. 3.

Figure 5:
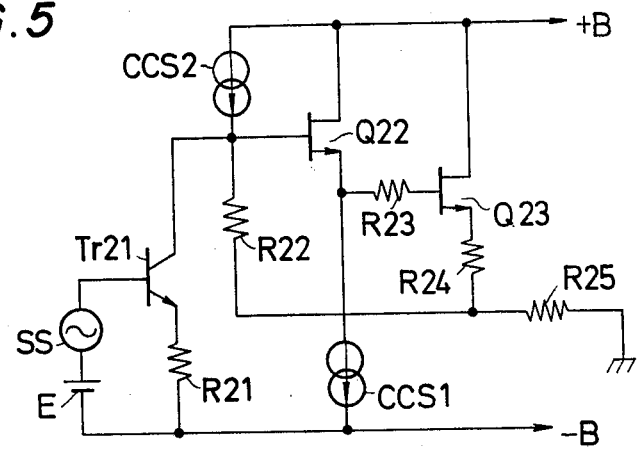

FIG. 5 shows another practical circuit structure, in which the resistance R12 of FIG. 4 is substituted with a constant current source CCS2 to stabilize the gate bias voltage of an FET Q22 and to protect a power FET Q23. In other respect, the circuit is similar to that of FIG. 4.

Figure 6:
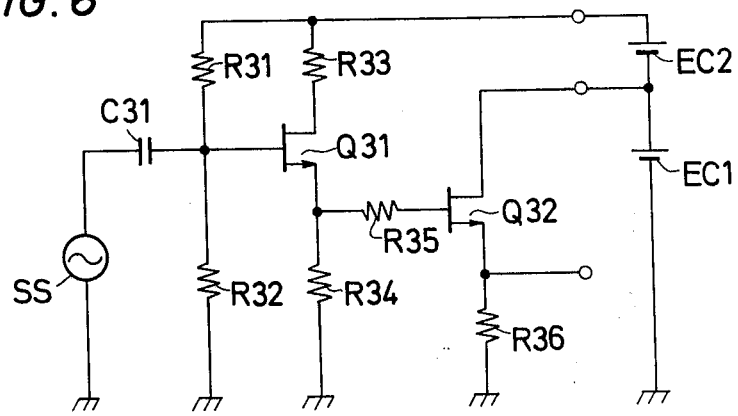

FIG. 6 shows another practical circuit structure, in which the maximum gate voltage of a power FET Q32 is determined by the internal drain-source resistance of a transistor Q31 at its fully conducting state and resistances R33 and R34 so that the power FET Q32 is over-driven with its gate voltage being swung up to, for example, +4V volts. The basic operation of the circuit of FIG. 6 is similar to that of the circuit of FIG. 3.

Figure 8:
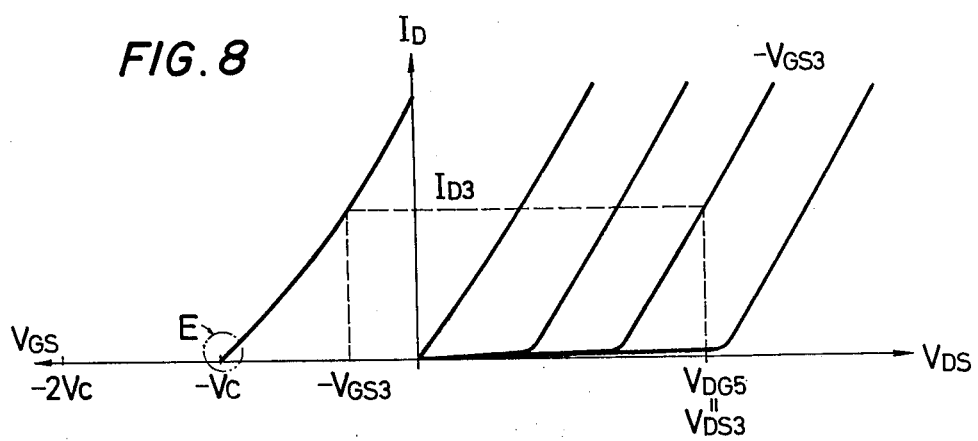
FIG. 8 is a diagram for explaining the operation of the circuit of FIG. 7.
Figure 7:
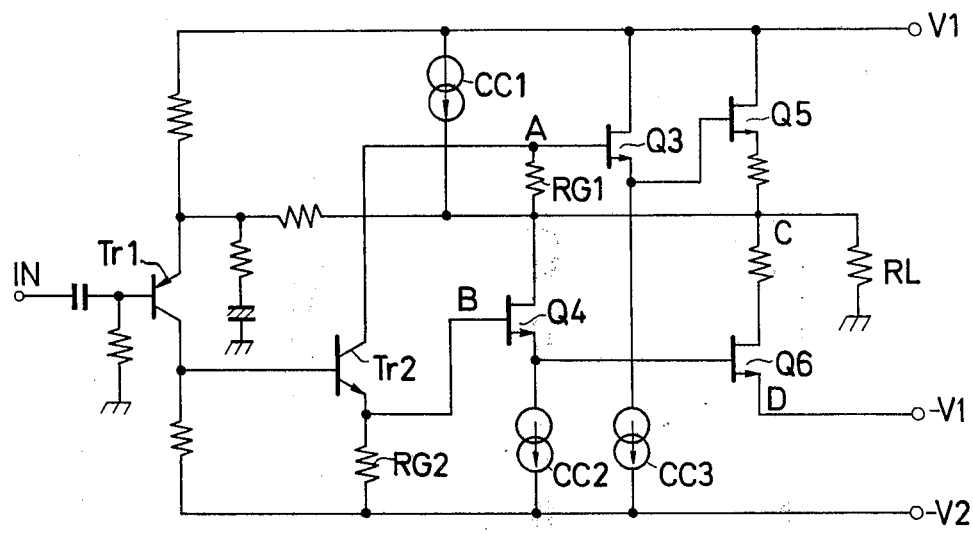

FIG. 7 shows another circuit structure in which FET's Q5 and Q6 are over-driven. Driving FET's Q3 and Q4 and power FET's Q5 and Q6 have similar triode-like characteristics as shown in FIG. 8. In the figure, letters Tr1 and Tr2 represent bipolar transistors, Q3 and Q4 FET's for driving the power FET's Q5 and Q6, CC1 to CC3 constant current sources, V1, −V1 and −V2 voltage sources, RL a load resistance and RG1 and RG2 gate resistors. Here, we assume that CC1 = Io (e.g. 10mA), RG1.Io = RG2.Io = Vc (e.g. 10V) and V2 = V1 + 2Vc.

When no signal voltage is applied to the input terminal IN, a current of Io is allowed to flow through the transistor Tr2. The voltage drop in the resistance RG1 due to this current is applied between the gate and the source of the FET Q5 through the FET Q3, hence the gate-to-source voltage $V_{GS5}$ of the FET Q5 becomes: $V_{GS5} \approx -Vc$, and the operation point (working bias) of the FET Q5 becomes near Point E. Similarly, due to the voltage drop in the resistance RG2 due to this current, the voltage VB at point B becomes: VB = −V2 + Vc = −V1 − Vc. Thus, the gate-to-source voltage $V_{GS6}$ of the FET 6 becomes: $V_{GS6} \approx -V1 - Vc - (-V1) = -Vc$. Hence, the operation point of the FET Q6 also becomes near point E. Here, assumptions are made that the gate-to-source voltages $V_{GS3}$ and $V_{GS4}$ and the source resistances of the FET's Q5 and Q6 are very small.

When the positively maximum swing of a signal is applied to the input terminal IN, the transistor Tr2 becomes cut off and the potential at point B becomes −V2. Thus, the gate-to-source voltage $V_{GS6}$ of the FET Q6 becomes −V2 − (−V1) = −2Vc to cut off the FET Q6. As the transistor Q2 is cut off, there occurs no voltage drop in the resistor RG1 and points A and C are at the same potential. In the FET Q5, however, a voltage drop $V_{DG5}$ is generated between the drain and the gate due to the resistance of the fully conducting FET Q5. This voltage is similarly applied between the drain and the source of the FET Q3 ($V_{DG5} = V_{DS3}$). A constant current $I_{D3}$ is always allowed to flow through the FET Q3 by the constant current source CC3, and hence a voltage $-V_{GS3}$ is generated between the gate and the source of the FET Q3 as is shown in FIG. 8. Thus, the gate potential of the FET Q5 (i.e. source potential of FET Q3) becomes higher than its source potential by $V_{GS3}$. Namely, the FET Q5 is over-driven.

When the negatively maximum swing of a signal is applied to the input terminal IN, the transistor Tr2 becomes fully conductive and a current of 2Io (Io from CCL and Io through RL) is allowed to flow. Due to the voltage drop 2Io.RG1 = 2Vc in the resistance RG1, the gate-to-source voltage of the FET Q5 becomes $V_{GS5} = -2Vc$ and the FET Q5 is cut off. Due to the voltage drop 2Io.RG2 = 2Vc in the resistance RG2, the potential at point B becomes −V2 + 2Vc = −V1 and equal to that at point D. As is described above in connection with the FET Q5, the gate potential of the FET Q6 becomes higher than its source voltage by $V_{GS4}$ and the FET Q6 is over-driven.

Figure 9:
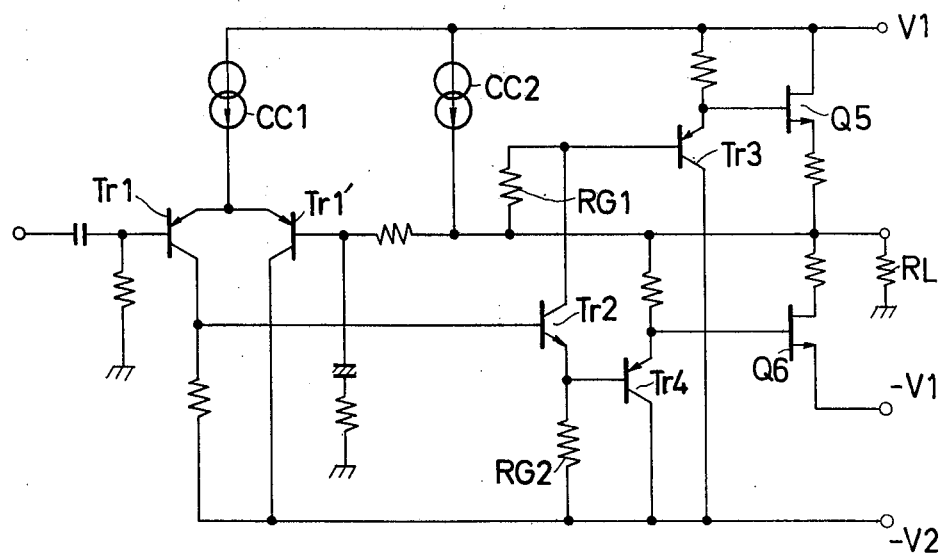
FIG. 9 is a circuit diagram of an amplifier for achieving the present invention.

In the circuit of FIG. 7, FET's Q3 and Q4 are used in the driving stage, but they may be substituted by bipolar transistors. FIG. 9 shows a circuit structure using bipolar transistors Tr3 and Tr4 in the driving stage. The circuit function is similar to that of the circuit of FIG. 7.

Although description has been made on driving an FET having triode-like characteristics, this invention is not limited to the method of driving an FET of triode-like characteristics. The utilization rate of the power source voltage can also be improved in the case of a junction FET having pentode-like characteristics according to this invention.

I claim:

1. A method of driving a triode-like junction field effect transistor for increasing its maximum power output: comprising the step of over-driving said transistor by applying thereto a forward gate-to-source voltage which is greater in the forward biasing direction than zero volts.

2. A method of driving a triode-like junction field effect transistor for increasing its maximum power output:
   comprising the step of over-driving said transistor by applying thereto a forward gate-to-source voltage which is greater in the forward biasing direction than zero volts, and
   in which said forward gate-to-source voltage is set at a value at which substantially no gate current is allowed to flow but beyond which the gate current increases rapidly.

3. A method of driving a junction field effect transistor for increasing its maximum power output:
   comprising the step of over-driving said transistor by applying thereto a forward gate-to-source voltage which is greater in the forward biasing direction than zero volts, and
   in which said forward gate-to-source voltage is generated by the use of the gate-to-source voltage of a preceding field effect transistor, the two field effect transistors being connected in source-follower connection.

4. A method of driving a junction field effect transistor for increasing its maximum power output:
   comprising the step of over-driving said transistor by applying thereto a forward gate-to-source voltage which is greater in the forward biasing direction than zero volts, and
   in which said forward gate-to-source voltage is generated by the use of the base-to-emitter voltage of a preceding transistor, said field effect transistor being connected in emitter-follower connection with said preceding transistor.

5. A system of driving a junction field effect transistor for increasing its maximum power output;
   comprising a junction field effect transistor having a gate, source and drain for deriving power,
   a signal source of a predetermined maximum signal swing level, and
   circuit means for connecting said signal source across the gate and source of said junction field effect transistor,
   said circuit means having circuit parameters so selected that at least at the maximum input signal swing level said transistor is over-driven because the gate-to-source voltage for said field effect transistor is then greater than zero volts in the forward biasing direction.

6. A system of driving a junction field effect transistor according to claim 5, in which said circuit means includes an active element having a control electrode, a first and a second current electrode and connected with said field effect transistor in Darlington connection for over-driving said field effect transistor as aforesaid.

7. An amplifier circuit for significantly improving the utilization rate of its power source voltage by overdriving a junction FET in its power amplifying stage comprising:
   a power amplifying stage including said junction FET,
   an input terminal,
   a driving stage for driving said power amplifying stage,
   first circuit means for electrically connecting said input terminal and driving stage, and
   said driving stage having circuit parameter means for causing a forward gate-to-source voltage to be applied to the junction FET at the vicinity of the instantaneous peaks of an input terminal signal having a large amplitude which is in the range close to the maximum amplitude that can be faithfully handled by both said driving stage and first circuit means.

8. An amplifier circuit as in claim 7 wherein said driving stage includes a source follower FET the source electrode of which is dc-coupled to the gate electrode of the FET of the power amplifying stage.

9. An amplifier circuit as in claim 8 wherein the gate electrode of said driving stage FET is connected to said input terminal and is dc-coupled to the source electrode of the FET of the power amplifying stage.

* * * * *